United States Patent
Tamezane

(10) Patent No.: US 9,071,072 B2
(45) Date of Patent: Jun. 30, 2015

(54) AVAILABLE CHARGING/DISCHARGING CURRENT CALCULATION METHOD AND POWER SUPPLY DEVICE

(75) Inventor: Shigeto Tamezane, Kakogawa (JP)

(73) Assignee: Sanyo Electric Co., Ltd., Osaka (JP)

( * ) Notice: Subject to any disclaimer, the term of this patent is extended or adjusted under 35 U.S.C. 154(b) by 1002 days.

(21) Appl. No.: 12/942,254

(22) Filed: Nov. 9, 2010

(65) Prior Publication Data

US 2011/0109273 A1    May 12, 2011

(30) Foreign Application Priority Data

Nov. 11, 2009   (JP) ................................. 2009-258442

(51) Int. Cl.
H02J 7/00 (2006.01)
H02J 7/14 (2006.01)
(Continued)

(52) U.S. Cl.
CPC ........... *H02J 7/0077* (2013.01); *B60L 11/1838* (2013.01); *B60L 11/1857* (2013.01);
(Continued)

(58) Field of Classification Search
USPC ......... 320/132, 133, 127, 128, 144, 153, 164, 320/161
See application file for complete search history.

(56) References Cited

U.S. PATENT DOCUMENTS 5,631,540 A * 5/1997 Nguyen .................. 320/127
5,672,951 A * 9/1997 Shiota .................... 320/132
(Continued)

FOREIGN PATENT DOCUMENTS

CN   1437031      8/2003
JP   2006-197727  7/2006

OTHER PUBLICATIONS

Chinese Office Action isssued Dec. 4, 2013 in corresponding Chinese patent application No. 201010546228.2.

*Primary Examiner* — Edward Tso
*Assistant Examiner* — Alexis Boateng
(74) *Attorney, Agent, or Firm* — Wenderoth, Lind & Ponack, LLP

(57) ABSTRACT

A method includes steps of dividing resistance R into a physical and chemical resistances $R_o$ and $R_p$, obtaining corrected open-circuit voltages $V_o$ corresponding to setting currents $I_a$ to $I_x$, acquiring predicted reaching voltages $V_a$ to $V_x$ corresponding to the setting currents $I_a$ to $I_x$, and creating a current-voltage curve. The corrected open-circuit voltages $V_o$ are obtained to predict available maximum currents $I_{target}$ in a particular time $t_2$. The predicted reaching voltages $V_a$ to $V_x$ are acquired based on corrected physical and chemical resistances $R_o$ and $R_p$, and the corrected open-circuit voltages $V_o$. The current-voltage curve is creased based on the setting currents $I_a$ to $I_x$ and the predicted reaching voltages $V_a$ to $V_x$ to acquire upper and lower limit voltages $V_{max}$ and $V_{min}$, and upper and lower limit currents $I_{max}$ and $I_{min}$ at a temperature whereby assigning these limit currents to available maximum currents $I_{target}$ in charging and discharging operations, respectively.

11 Claims, 6 Drawing Sheets

(51) Int. Cl.
  B60L 11/18 (2006.01)
  B60L 15/20 (2006.01)
  H01M 10/48 (2006.01)
  G01R 31/36 (2006.01)
  H01M 10/0525 (2010.01)

(52) U.S. Cl.
  CPC ......... B60L11/1859 (2013.01); B60L 11/1861 (2013.01); B60L 15/2045 (2013.01); B60L 2240/545 (2013.01); B60L 2240/549 (2013.01); G01R 31/3624 (2013.01); G01R 31/3662 (2013.01); H01M 10/0525 (2013.01); H01M 10/48 (2013.01); H01M 10/486 (2013.01); H01M 2220/20 (2013.01); Y02T 10/7005 (2013.01); Y02T 10/7011 (2013.01); Y02T 10/7044 (2013.01); Y02T 10/705 (2013.01); Y02T 10/7283 (2013.01); Y02T 90/121 (2013.01); Y02T 90/128 (2013.01); Y02T 90/14 (2013.01); Y02T 90/163 (2013.01)
  USPC ........... 320/132; 320/133; 320/134; 320/136; 320/104

(56) References Cited

U.S. PATENT DOCUMENTS

| | | | | |
|---|---|---|---|---|
| 5,808,443 | A | * | 9/1998 | Lundstrom .................... 320/164 |
| 6,850,038 | B2 | * | 2/2005 | Arai et al. ..................... 320/132 |
| RE39,908 | E | * | 11/2007 | Ikawa et al. ................... 320/136 |
| 7,489,108 | B2 | | 2/2009 | Matsumoto et al. |
| 2008/0088281 | A1 | * | 4/2008 | Paul et al. ..................... 320/141 |

* cited by examiner

US 9,071,072 B2

AVAILABLE CHARGING/DISCHARGING CURRENT CALCULATION METHOD AND POWER SUPPLY DEVICE

BACKGROUND OF THE INVENTION

1. Field of the Invention

The present invention relates to an available charging/discharging current calculation method and a power supply device that can estimate the maximum available charging/discharging currents of batteries, and in particular to an available charging/discharging current calculation method and a power supply device that can estimate the maximum current of batteries that drive an electric motor for driving a vehicle, for example.

2. Description of the Related Art

A battery has the electrical property of deteriorating If the battery is discharged at a large amount of current when the remaining capacity of the battery is low, or if the battery is charged at a large amount of current when the remaining capacity of the battery is high. For this reason, it is important for batteries of a power supply device that drives an electric motor of a vehicle, for example, to restrict the maximum charging/discharging currents in accordance with the remaining capacities of the batteries. In the case where the maximum current is not restricted, when the remaining capacity of the battery is low, if the batteries are discharged at a large amount of current so that the voltages of the batteries abruptly fall under hard acceleration, or when the remaining capacity of the battery is high, if the batteries are charged at a large amount of current so that the voltages of the batteries abruptly increase under hard braking, problems will arise such as remarkable battery property reduction, and the like. Since in particular vehicle power supply devices charge/discharge batteries at a very large amount of current, the life of the battery will be very short if the maximum current is not restricted. This maximum current restriction is important for power supply devices used for applications that require high output of batteries such as for vehicle (e.g., automobile), bicycle and power tool.

On the other hand, a device to be driven by a power supply device requires a current as much as possible. For this reason, in order that batteries can be charged/discharged at a current as much as possible within a range in that the electrical properties of the batteries do not deteriorate, it is important to accurately calculate the maximum current that is available in the power supply device. As this type of current calculation method, a method has been known that calculates a charging/discharging current limit value by referencing a table that is previously obtained by experimental measurement based on the remaining capacities (state-of-charge: SOC) of batteries, charging/discharging current amounts, the temperatures of batteries and the like that are detected by detectors. Also, a method has been known that calculates a charging/discharging current limit value by using a predetermined model (e.g., mathematical model) based on the voltages of batteries (e.g., open circuit voltage: OCV; $V_o$) that are detected by detectors.

However, the table-referencing method cannot respond to the hysteresis variation of batteries. For this reason, there is a problem in that errors of the detected remaining capacity and temperatures directly affect the calculation.

Also, in the model-using method, the remaining capacity detection is significantly affected by an error of the resistance caused by a synchronization time lag between current detection and voltage detection. In addition, this method may allow an excess amount of current depending on the hysteresis states of the batteries.

When the remaining capacity is improperly detected, if an excess amount of current is allowed, batteries may have an overload in charging/discharging operation. This may cause remarkable deterioration of battery life. Also, the remaining capacity varies due to battery self discharging.

These factors cause difficulty of estimation of battery remaining capacity. For this reason, it is very difficult to accurately calculate the remaining capacity (see Japanese Patent Laid-Open Publication No. 2006-197727).

The present invention is aimed at solving the problems. It is a main object of the present invention to provide an available charging/discharging current calculation method and a power supply device that can accurately estimate the maximum available charging/discharging current values of batteries based on the charging/discharging currents, voltages and temperatures of the batteries.

SUMMARY OF THE INVENTION

To achieve the above object, an available charging/discharging current calculation method according to a first aspect of the present invention estimates available maximum current values in charging/discharging operations of batteries based on at least one of battery current, voltage and temperature. This method includes the steps of calculating a resistance value R, dividing the calculated resistance value R, correcting the chemical resistance component $R_p$, acquiring voltage variation values $V_h$, correcting the physical resistance component $R_o$, estimating battery open-circuit voltages $V_o$, obtaining corrected battery open-circuit voltages $V_o$, acquiring predicted reaching voltages $V_a$ to $V_x$, and creating a battery current-voltage curve. The resistance value R is calculated based on an average current value and an average voltage obtained in a predetermined time period. The average current value can be obtained based on average current values $I_1$ and $I_2$ each of which is obtained in a predetermined time period and average voltages $V_1$ and $V_2$. The average voltage valued can be obtained based on average voltages $V_1$ and $V_2$ each of which is obtained in a predetermined time period. The calculated resistance value R is divided into a physical resistance component $R_o$ and a chemical resistance component $R_p$. The chemical resistance component $R_p$ is corrected based on the pulse discharging or charging operation time $t_1$ from the past to the present. The voltage variation values $V_h$ is acquired in the history of the past charging/discharging operations. The physical resistance component $R_o$ is corrected based on a detected battery temperature and a detected battery remaining capacity SOC. The battery open-circuit voltages $V_o$ is estimated based on the physical and chemical resistance components $R_o$ and $R_p$, and a current I, a voltage V and the voltage variation values $V_h$. The corrected battery open-circuit voltages $V_o$ corresponding to a plurality of setting currents $I_a$ to $I_x$ is obtained in order to predict the available maximum current values $I\_{target}$ in a particular time $t_2$. The predicted reaching voltages $V_a$ to $V_x$ corresponding to the plurality of setting currents $I_a$ to $I_x$ is acquired based on the corrected physical resistance component. Ro, the corrected chemical resistance component $R_p$ and the corrected battery open-circuit voltages $V_o$. The battery current-voltage curve is created based on the setting currents $I_a$ to $I_x$ and the predicted reaching voltages $V_a$ to $V_x$ to acquire upper and lower limit voltages $V_{max}$ and $V_{min}$ and upper and lower limit currents $I_{max}$ and $I_{min}$ at a temperature whereby assigning the upper and lower limit currents $I_{max}$ and $I_{min}$ to the available maximum current values $I\_{target}$ in charging operation and discharging operation, respectively. Therefore, it is possible to accurately calculate available maximum current values in the charging/discharging operations.

In an available charging/discharging current calculation method according to a second aspect of the present invention can further includes, in order to predict the available maximum current values $I_{target}$ in the particular time $t_2$, correcting the chemical resistance component $R_p$ based on the prediction time $t_2$ or the sum of the pulse time until the present and the prediction time $t_1+t_2$, and correcting the physical resistance component $R_o$ based on the battery remaining capacities $SOC_a$ to $SOC_n$ corresponding to a plurality of setting currents $I_a$ to $I_x$ and the battery temperature. In this method, the chemical and physical resistance components can be additionally corrected.

In an available charging/discharging current calculation method according to a third aspect of the present invention, the resistance value R can be a weighted average value of a resistance value $R_{old}$ acquired in the past and a resistance value $R_{now}$ acquired at the present.

In an available charging/discharging current calculation method according to a fourth aspect of the present invention, the voltage variation $V_h$ can be the sum of values obtained by products. Each of the products is obtained by multiplying each of chemical resistances $R_p$, the current I, and a coefficient. These chemical resistances $R_p$ are subjected to the time-based correction in a predetermined times of pulse charging/discharging operations in the past. The coefficient depends on time from the end of each of the pulse charging/discharging operations.

In an available charging/discharging current calculation method according to a fifth aspect of the present invention, the lower limit voltage $V_{min}$ can be set at a voltage until which the battery current-voltage curve can continuously have linearity.

In an available charging/discharging current calculation method according to a sixth aspect of the present invention, if the lower limit voltage $V_{min}$ can be set at a low voltage until which the battery current-voltage curve cannot continuously have linearity, the predicted reaching voltages $V_a$ to $V_x$ are corrected.

In an available charging/discharging current calculation method according to a seventh aspect of the present invention, if the lower limit voltage $V_{min}$ is set at a low voltage until which the battery current-voltage curve cannot continuously have linearity, the predicted reaching voltages $V_a$ to $V_x$ can be corrected.

In an available charging/discharging current calculation method according to an eighth aspect of the present invention, in order to correct the predicted reaching voltages $V_a$ to $V_x$, the predicted reaching voltages $V_a$ to $V_x$ are corrected based on the difference or ratio between the predicted reaching voltages $V_a$ to $V_x$ and the lower limit voltage $V_{min}$ until which the battery current-voltage curve can continuously have linearity.

In an available charging/discharging current calculation method according to a ninth aspect of the present invention, when a detected voltage V is not higher than a setting voltage $V_x$, the chemical resistance component $R_p$ is corrected.

In an available charging/discharging current calculation method according to a tenth aspect of the present invention, the batteries can be lithium-ion rechargeable batteries.

In an available charging/discharging current calculation method according to an eleventh aspect of the present invention can further include transmitting the estimated available charging/discharging current values to a connected device that has an information processing system. In this method, appropriate available maximum currents can be successively informed to connected devices such as HEV vehicle.

An available charging/discharging current calculation method according to a twelfth aspect of the present invention estimates available maximum current values in charging/discharging operations of batteries based on at least one of battery current, voltage and temperature. This method includes the steps of detecting a battery voltage $V_n$, calculating available charging/discharging current values, and transmitting the calculated available charging/discharging current values to a connected device. The available charging/discharging current values bring the detected voltage $V_n$ within a range lower than a setting voltage $V_x$. The gradient of a battery current-voltage curve sharply changes at the voltage $V_x$.

An available charging/discharging current calculation method according to a thirteenth aspect of the present invention can further include calculating a corrected voltage value that is obtained by subtracting a setting voltage value $\Delta V_{W\_max}$ determined depending on the type of the batteries from a voltage value in the calculated available charging/discharging current values; and transmitting the corrected voltage value after the correction to the connected device. In this method, batteries can be used in a wider voltage range. Therefore, charging/discharging currents can be correspondingly set at high value.

A power supply device according to a fourteenth aspect includes a voltage detecting portion 12, a temperature detecting portion 14, a current detecting portion 16, a calculating portion 18, and a communication processing portion 19. The battery unit 20 includes a plurality of rechargeable batteries. The voltage detecting portion 12 detects the voltages of the rechargeable batteries included the battery unit 20. The temperature detecting portion 14 detects the temperatures of the rechargeable batteries included the battery unit 20. The current detecting portion 16 detects the currents flowing through the rechargeable batteries included the battery unit 20. The calculating portion 18 calculates the maximum restriction current values on the rechargeable batteries based on signals provided from the voltage detecting portion 12, the temperature detecting portion 14 and the current detecting portion 16. The communication processing portion 19 transmits a remaining capacity and the maximum restriction current values calculated by the calculating portion 18 to a connected device. The calculating portion 18 can calculate available charging/discharging current values so that the voltages $V_n$ detected by the voltage detecting portion fall within a range lower than a setting voltage $V_x$ at which the gradient of a battery current-voltage curve sharply changes. In this device, batteries can be used in a wider voltage range. Therefore, charging/discharging currents can be correspondingly set at high value.

In a power supply device according to a fifteen aspect, the calculating portion 18 can calculate a corrected voltage value that is obtained by subtracting a setting voltage value $\Delta V_{W\_max}$ determined depending on the type of the batteries from a voltage value in the calculated available charging/discharging current values, and can transmit the corrected voltage value to the connected device. In this device, the voltage value is intentionally set at a low value so that current can be increased. As a result, it is possible to provide higher electric power.

The above and further objects of the present invention as well as the features thereof will become more apparent from the following detailed description to be made in conjunction with the accompanying drawings.

DETAILED DESCRIPTION OF THE EMBODIMENT(S)

Figure 1:
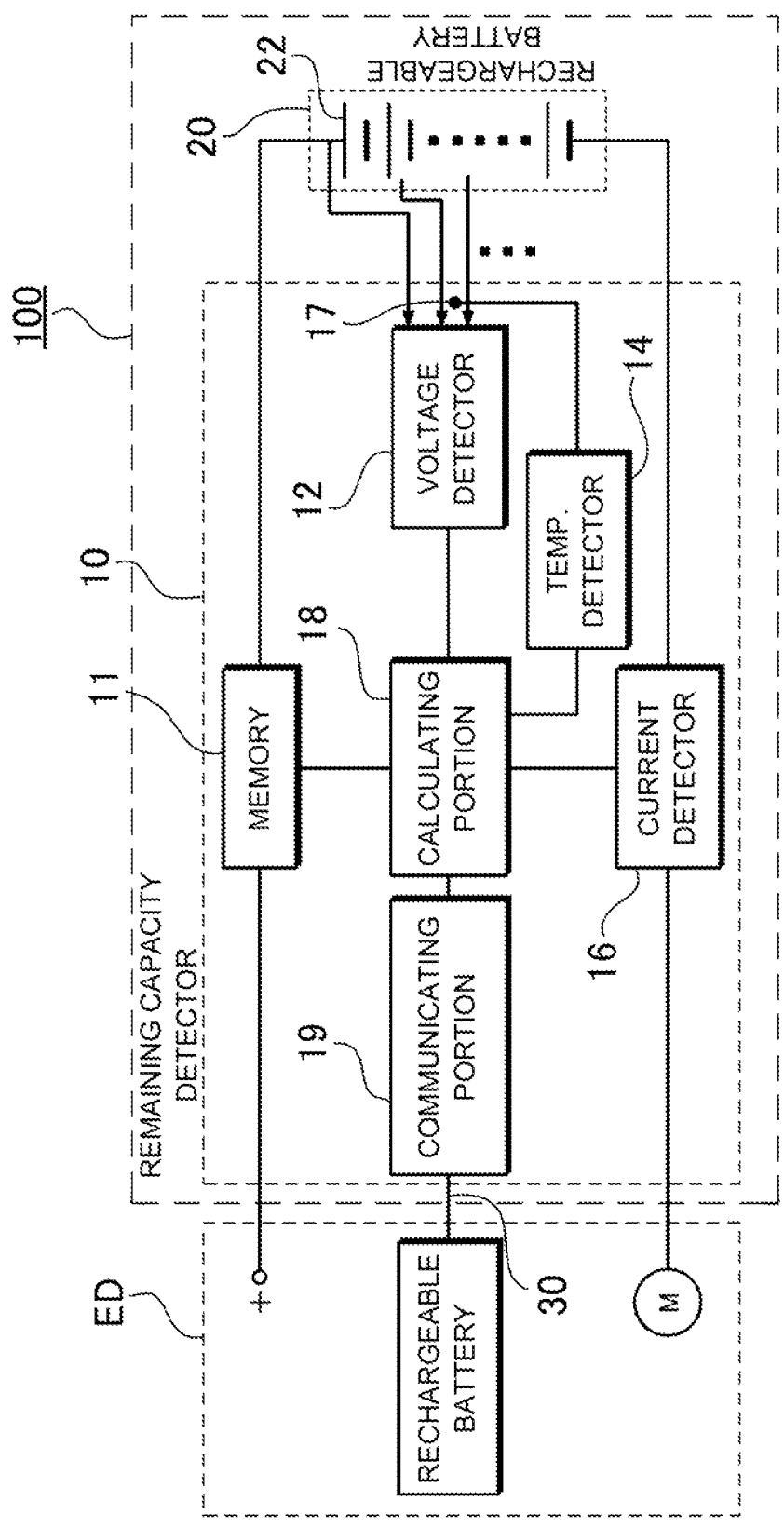
FIG. 1 is a block diagram showing an exemplary power supply device used for a method for controlling restriction currents of batteries according to an embodiment of the present invention.

The following description will describe embodiments according to the present invention with reference to the drawings. It should be appreciated, however, that the embodiments described below are illustrations of a rechargeable battery power control method and a power supply device to give a concrete form to technical ideas of the invention, and a rechargeable battery power control method and a power supply device of the invention are not specifically limited to description below. Furthermore, it should be appreciated that the members shown in claims attached hereto are not specifically limited to members in the embodiments. Unless otherwise specified, any dimensions, materials, shapes and relative arrangements of the members described in the embodiments are given as an example and not as a limitation. Additionally, the sizes and the positional relationships of the members in each of drawings are occasionally shown larger exaggeratingly for ease of explanation. Members same as or similar to those of this invention are attached with the same designation and the same reference numerals, and their description is omitted. In addition, a plurality of structural elements of the present invention may be configured as a single part that serves the purpose of a plurality of elements, on the other hand, a single structural element may be configured as a plurality of parts that serve the purpose of a single element. Also, the description of some of examples or embodiments may be applied to other examples, embodiments or the like.
(Power Supply Device 100)

FIG. 1 is a block diagram showing the construction of a power supply device used for a method for calculating available charging/discharging battery currents according to an embodiment of the present invention. The illustrated power supply device 100 includes a battery unit 20 containing rechargeable batteries 22, and a remaining capacity detector 10. The remaining capacity detector 10 includes a voltage detecting portion 12, a temperature detecting portion 14, a current detecting portion 16, a calculating portion 18, and a communication processing portion 19. The voltage detecting portion 12 detects the voltages of the batteries. The temperature detecting portion 14 detects the temperatures of the batteries. The current detecting portion 16 detects the currents flowing through the batteries. The calculating portion 18 calculates the battery remaining capacity based on signals provided from the voltage detecting portion 12, the temperature detecting portion 14 and the current detecting portion 16, and calculates the maximum restriction current values on a battery unit 20 based on the remaining capacity or the battery temperatures. The communication processing portion 19 transmits the calculated remaining capacity and the maximum restriction current values to a connected device ED. The communication processing portion 19 is connected to a connected-device communication terminal 30. The communication processing portion 19 is connected to a connected device through the connected-device communication terminal 30, and transmits signals that represent the remaining capacity and the maximum restriction current values to the connected device. In this embodiment, a vehicle such as automobile is used as the connected device. The power supply device is installed on the vehicle, and energizes an electric motor M that drives the vehicle. The communication processing portion 19 is connected to and communicates with a vehicle side control portion included in the vehicle. The following description will describe a power supply apparatus for vehicles.

The rechargeable batteries 22 contained in the battery unit 20 are lithium-ion rechargeable batteries. The lithium-ion rechargeable batteries have an advantage in that the relationship between SOC and OCV can be easily specified as compared with the nickel-hydrogen batteries, and the like. Conversely, since the relationship between SOC and OCV in nickel-hydrogen batteries is fuzzy and often fluctuates, it is not easy to specify the relationship between SOC and OCV in nickel-hydrogen batteries. One battery cell may be used. Also, a plurality of batteries can be used that are connected in serial or parallel, or in serial and parallel combination. a plurality of battery cells are connected to each other to compose a module or battery block. A plurality of modules are coupled to each other to compose the battery unit 20.

The voltage detecting portion 12 detects the voltages of the rechargeable batteries 22 included in the battery unit 20. In the illustrated battery unit 20, the cell voltages of the plurality of rechargeable batteries 22 are detected. However, the power supply device is not limited to the construction in that all the battery voltages are detected. The power supply device may detect only the battery voltages of representative battery cells or the battery voltage of each of the battery modules, composes the battery unit 20. The voltage detecting portion 12 provides the detected voltages as analog signals to the calculating portion 18, or provides digital signals that are converted from the analog signals by an A/D converter to the calculating portion 18. The voltage detecting portion 12 detects the battery voltages periodically at a constant sampling period or constantly, and provides the detected voltages to the calculating portion 18. The calculating portion 18 obtains the voltage of a battery by averaging a plurality voltage values that are provided within a predetermined time period. Thus, the calculating portion 18 can accurately calculate the remaining capacity of this battery. The predetermined time period in this method can be 0.5 to 5 seconds, or 1 to 10 seconds.

The temperature detecting portion 14 includes temperature sensors 17 that detect the temperatures of the batteries included in the battery unit 20. The temperature sensors 17 are in contact with the surfaces of the batteries or are in thermal contact with the batteries via heat conductive materials. Alternatively, the temperature sensors 17 are arranged close to the batteries, and are thermally coupled to the batteries. Thus, the temperature sensors 17 can detects the battery temperatures.

The temperature sensors 17 are thermistors. However, the temperature sensor 17 can be any elements capable of converting a temperature into an electric resistance such as PTC and varistor. Also, an example of the temperature sensor 17 can be provided by an element that can detect infrared rays radiated from a battery and detect the temperature of the battery without in contact with the battery. The temperature detecting portion 14 also provides the detected battery temperatures as analog signals to the calculating portion 18, or provides digital signals that are converted from the analog signals by an A/D converter to the calculating portion 18. The temperature detection portion 14 detects the temperature of a battery periodically at a constant sampling period or constantly, and provides the detected temperature of this battery to the calculating portion 18.

The current detecting portion 16 includes resistor elements each of which is connected to a battery in serial, and detects a voltage difference that is produced between the both ends of the resistor element. Thus, the current detecting portion 16 can detect discharging currents that flow through the batteries. The resistor elements are resistors with a low resistance. However, a semiconductor element such as transistor or FET can be used as the resistor element. Since charging and discharging currents flow through a battery in the directions opposite to each other, the voltage difference is produced in the resistor element in different polarities. For this reason, a discharging current can be detected based on the polarity of the voltage difference in the resistor element. Accordingly, currents can be detected based on the voltage difference produced in the resistor element. The reason is that the current is proportional to the voltage difference produced in the resistor element. This current detecting portion 16 can precisely detect the discharging currents of the batteries. However, the current detecting portion 16 may detect a current by sensing magnetic flux that leaks external of a lead line due to a current flowing through the lead line. The current detecting portion 16 also provides the detected discharge currents as analog signals to the calculating portion 18, or provides digital signals that are converted from the analog signals by an A/D converter to the calculating portion 18. The current detection portion 16 detects the discharging current in a battery periodically at a constant sampling period or constantly, and provides the detected discharging current of this battery to the calculating portion 18.

In the device that provides the signals of digital values from the voltage, temperature and current detecting portions 12, 14 and 16 periodically at a constant sampling period, the digital signals from the detecting portions are provided one after another to the calculating portion 18 with the signal-providing time points being shifted from each other. The calculating portion 18 integrates the discharging currents of a battery and detects the discharging amount of this battery. Thus, the calculating portion 18 can calculate the remaining capacity of this battery by subtracting the detected discharging amount. A memory 11 is connected to the calculating portion 18. The calculating portion 18 stores values and data required for these types of calculation, settings, look-up table LUT and the like in the memory 11. The memory 11 can be a non-volatile memory such as $E^2PROM$, or a volatile memory such as RAM.

(Available Charging/Discharging Battery Current Calculation Method)

In the power supply device, which drives the electric motor of the vehicle, a charging/discharging battery current limit value is determined based on the remaining capacities of the batteries. The maximum available charging/discharging current value is set at the charging/discharging current limit value. The batteries are charged/discharged at a current lower than the maximum available charging/discharging current value. Conventionally, the charging/discharging current limit value has been set at the maximum current that is available in charging/discharging operation of the batteries within a range that can suppress deterioration of the batteries. In particular, in power supply devices that employ nickel-hydrogen batteries or nickel-cadmium batteries as rechargeable batteries, importance has been placed on suppression of battery deterioration caused by over-charge and over-discharge. According to experiment by the inventor, it is found that lithium-ion rechargeable batteries can be continuously used without problem in practice even in the case where the voltages of lithium-ion rechargeable batteries are set higher as compared with nickel-hydrogen batteries, or the like. In nickel-hydrogen batteries and nickel-cadmium batteries, the relationship between SOC and OCV is fuzzy. For this reason, it is difficult to uniquely determine the relationship between SOC and OCV in nickel-hydrogen batteries and nickel-cadmium batteries. But, it is found that, contrary to this, the relationship between SOC and OCV can be sufficiently determined in lithium-ion rechargeable batteries, and as a result that battery voltage and current can be accurately controlled. The method for calculating available charging/discharging currents according to the present invention has been devised based on the findings. This method can suppress deterioration of batteries but can charge/discharge the batteries at a larger amount of current than conventional methods.

Figure 2:
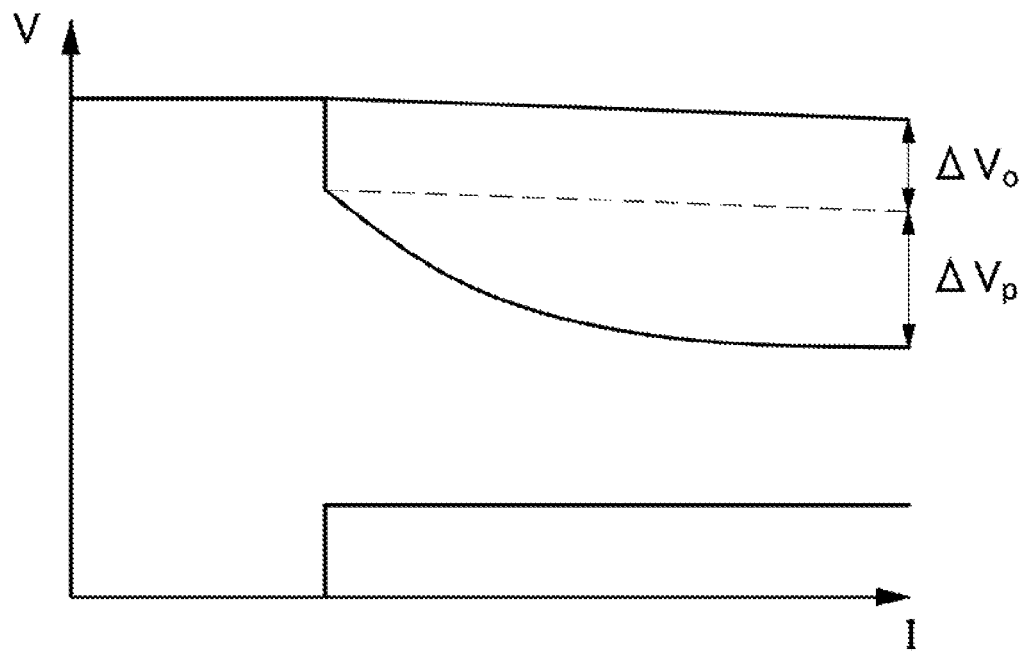
FIG. 2 is a graph showing time variation of the voltage V of a battery cell.

FIG. 2 shows time variation of the voltage V of a battery cell. voltage V falls when the battery starts being discharged at current I. This falling amount $\Delta V$ can be divided into two components of $\Delta V_O$ and $\Delta V_P$. $V_O$ is a substantially constant component. The falling amount of $\Delta V_O$ can expressed as voltage drop by a resistor. That is, in the case where current I is constant, the falling amount of $\Delta V_O$ can expressed by $\Delta V_O = R_O * I$. $R_O$ corresponds to a constant component of resistance value R.

$\Delta V_P$ is a time-varying component. The value of $\Delta V_P$ can be expressed by $\Delta V_P = R_P * I$, where $R_P$ is a time-varying component of the resistance value R. In the case where the resistance value R of the battery cell is divided into the constant component $R_o$ and the time-varying $R_p$, $R_o$ corresponds to a physical resistance. If the environmental temperature and aged deterioration are ignored, $R_o$ can be considered substantially constant as an ohmic resistance. $R_p$ corresponds to a chemical resistance, and can be considered as a polarization resistance. It can be considered that the maximum value of available charging/discharging current more accurately can be estimated when the resistance is divided into the resistance components and the resistance components are independently corrected.

Figure 3:
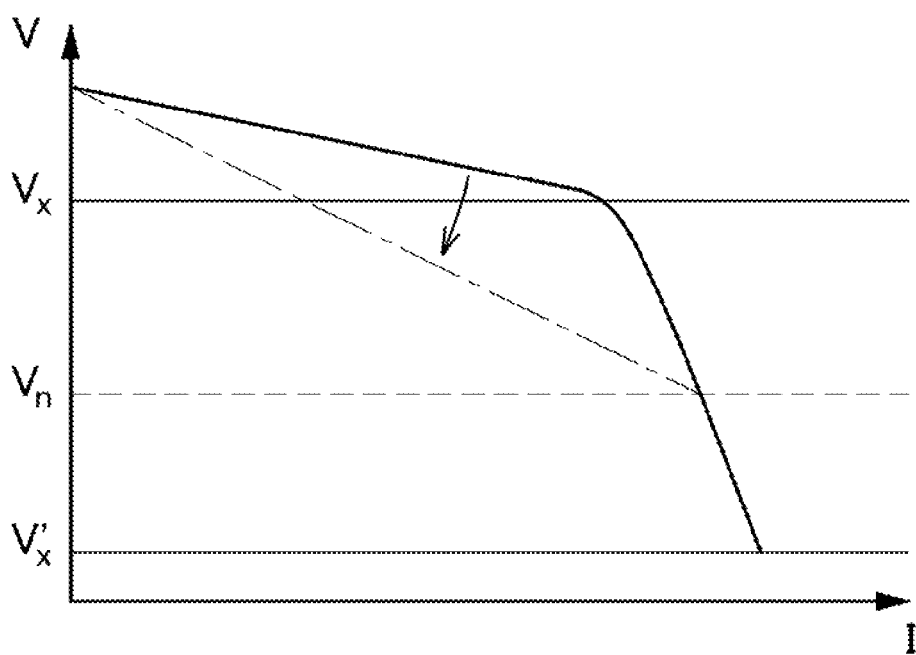
FIG. 3 is a graph showing the relationship between current I and voltage V in discharging operation of the battery cell.

FIG. 3 schematically shows the relationship between current I and voltage V (battery current-voltage curve; I-V plot) in discharging operation of the battery cell. As shown in this Figure, voltage V decreases at a substantially constant gradient with increase of current I. The gradient of voltage V sharply changes at a certain voltage (setting voltage) $V_x$. For this reason, an available charging/discharging current voltage will be estimated to be able to agree with the setting voltage $V_x$. In particular, in conventional nickel-hydrogen batteries, it has been considered that the batteries deteriorate faster, if voltage becomes lower than $V_x$. For this reason, the charging/discharging operation has been controlled based on the available charging/discharging current voltage that is calculated so as to agree with the setting voltage $V_x$. Contrary to this, according to the experiment by the inventor, it is found that, in lithium-ion rechargeable batteries, the effect on their lives falls within a range in that problems do not arise, even when the voltage of a lithium-ion rechargeable battery becomes lower than the setting voltage $V_x$. For this reason, even when the voltage of a lithium-ion rechargeable battery is low, if the voltage does not fall to a lower limit voltage $V'_x$, the lithium-ion rechargeable battery can be charged/discharged. Therefore, the lithium-ion rechargeable battery can be charged/discharged in a wider voltage range. In other words, charging/discharging operation can controlled so as to hold the voltage of a lithium-ion rechargeable battery not only in a conventional range not less than the setting voltage $V_x$ but also in a range not less than the voltage $V'_x$. In this case, charging/discharging operation may be controlled based on a straight line shown by a single-dot-dashed line that makes approximation of the I-V plotted line.

Figure 4:
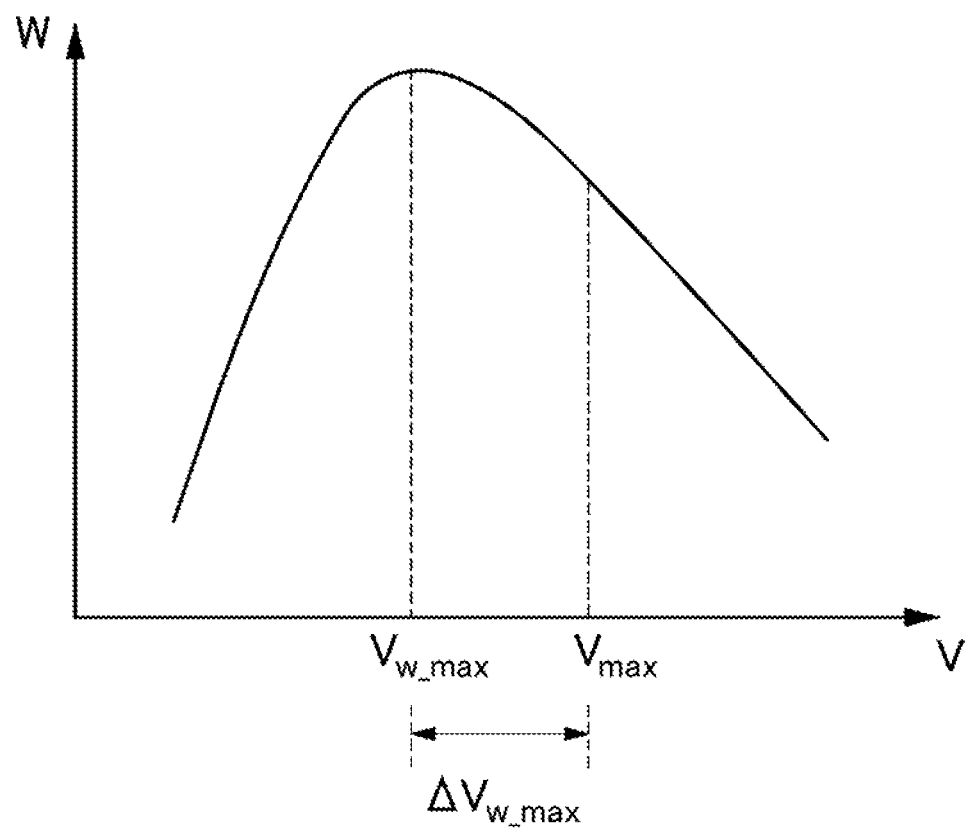
FIG. 4 is a graph showing the relationship between voltage V of the battery cell and electric power W that can be provided at the voltage.

FIG. 4 schematically shows the relationship between voltage V of the battery cell and electric power W that can be provided at the voltage. The electric power W can be obtained by multiplying voltage V by current I at the voltage V. For example, the inventor finds that, in the case where the available charging/discharging current voltage is estimated at $V_{max}$, the peak value of available electric power W is provided at $V_{W\_max}$ that is lower than $V_{max}$ by $\Delta V_{W\_max}$. From the findings, when the available charging/discharging current voltage is intentionally set at the voltage $V_{W\_max}$, which is lower than the estimated voltage $V_{max}$ by $\Delta V_{W\_max}$, it is possible to a larger amount of electric power. In the case of lithium-ion rechargeable batteries, $\Delta V_{W\_max}$ is about 0.2 V.

Figure 5:
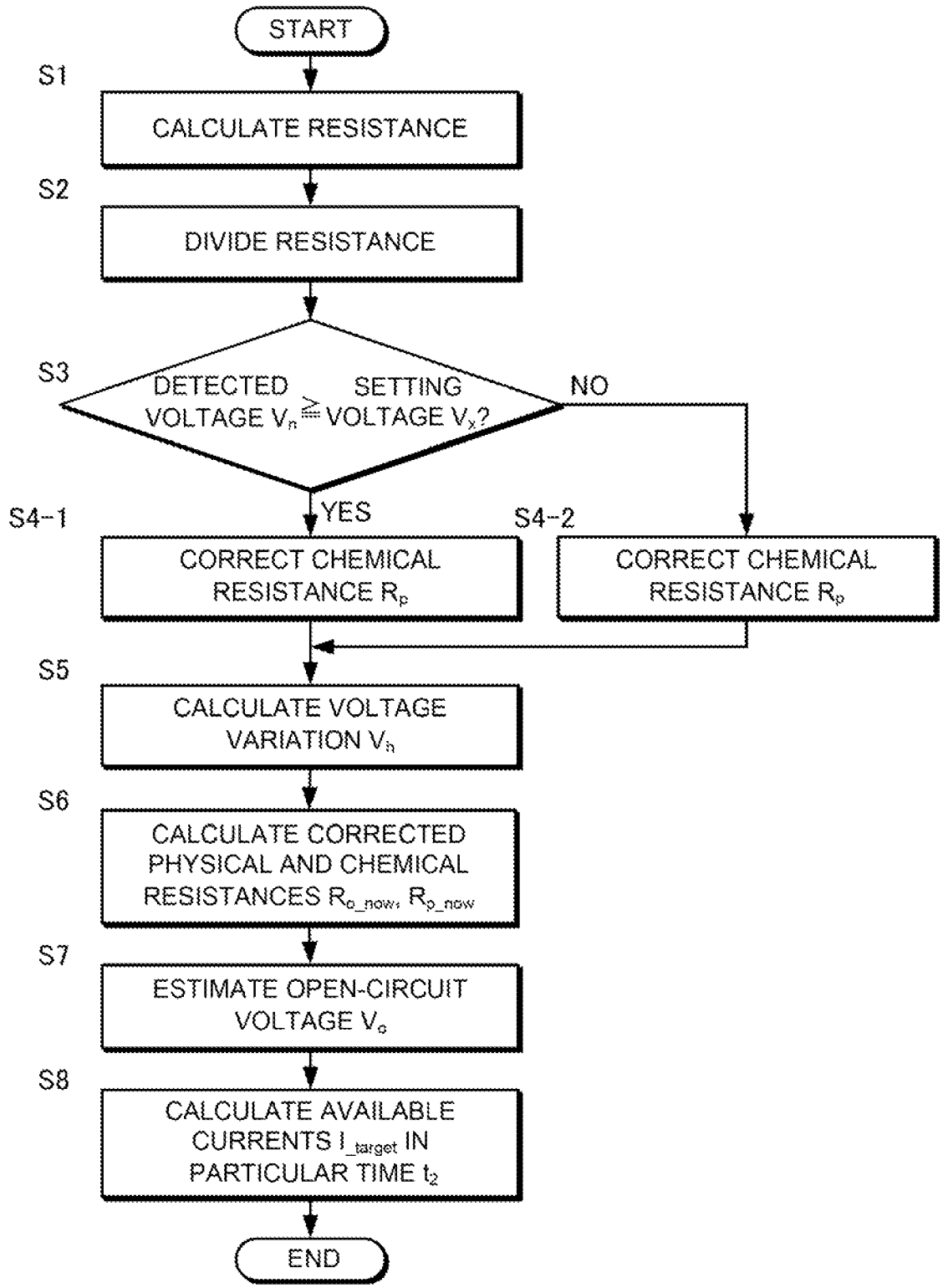
FIG. 5 is a flow chart of a method for calculating available charging/discharging battery currents.

The following description will describe the available charging/discharging battery current calculation method with reference to a flowchart of FIG. 5.

(Step S1, Resistance Calculation)

First, the resistance is calculated. In this embodiment, the resistance value R is calculated based on two average current values $I_1$ and $I_2$, and average voltages $V_1$ and $V_2$ at the average current values $I_1$ and $I_2$. In this embodiment, $I_2$ and $V_2$ are an average current and an average voltage in a period from −2 to 0 seconds. $I_1$ and $V_1$ are an average current and an average voltage in a period from −4 to −2 seconds. In addition, a battery cell temperature is detected. A current resistance value $R_{now}$ is calculated based on the following equation including these average currents and average voltages.

$$R_{now}=(V_2-V_1)/(I_2-I_1) \quad \text{Equation 1}$$

According to the experiment by the inventor, it is found that good results are provided by average currents and average voltages during a time period in a range of 0.5 to 5 seconds. If the sampling period is short, charging/discharging operation can be accurately controlled. However, if the sampling period is less than 0.5 second, the averaging effect deteriorates. On the other hand, if the sampling period is more than 5 seconds, information on the available charging/discharging current is less frequently transmitted to the vehicle side. Accordingly, control accuracy will deteriorate. the sampling period is preferably set at about 2 seconds. Subsequently, the resistance value R is calculated as a weighted average resistance based on the following equation including this current resistance value $R_{now}$, and a previous resistance value $R_{old}$.

$$R=R_{now}*a_1+R_{old}*(1-a_1) \quad \text{Equation 2}$$

In this equation, $a_1$ is a weighting coefficient, and is set at a value in a range of 0 to 1. In this embodiment, the weighting coefficient is set at 0.05. That is, the weighted ratio of the resistance value $R_{old}$ obtained in previous calculation is 95%, while the weighted ratio of the newly-obtained resistance value $R_{now}$ is 5%.

(Step S2, Resistance Division)

Subsequently, in Step S2, the resistance calculated in Step S1 is divided into the physical resistance component $R_o$ and the chemical resistance component $R_p$. In this embodiment, it is assumed that the physical resistance component $R_o$ corresponds to a substantially constant ohmic resistance, and does not vary with time. Strictly speaking, the physical resistance component varies with deterioration caused by aging, but such variation is not taken into consideration in this embodiment. In short, the physical resistance component $R_o$ refers to a constant component that does not vary with time.

The chemical resistance component $R_p$ corresponds to a polarization resistance component, and varies with time. The physical resistance component $R_o$ and the chemical resistance component $R_p$ are calculated based on the following equation.

$$R_{ini}=R_{o\ ini}+R_{p\ ini}*t_{au\ t}$$

$$R_o=R/R_{ini}*R_{o\ ini} \quad \text{Equation 3}$$

$R_{ini}$, $R_{o\ ini}$, and $R_{p\ ini}$ are obtained from the look-up table LUT that is previously created in accordance with battery temperatures. Also, $t_{au\ t}$ is obtained from the look-up table LUT that is previously created in accordance with a sampling time period of the chemical resistance component $R_p$. The exemplary sampling time period is set at 2 seconds. $t_{au\ t}$ can be obtained by referencing a value corresponding to 2 seconds in LUT.

(Step S3, Comparison between Detected Voltage $V_n$, and Setting Voltage $V_x$)

A detected voltage $V_n$ is compared with the setting voltage $V_x$. The setting voltage $V_x$ refers to a voltage at which the gradient of voltage V sharply changes in the I-V plot. In this comparison, if detected voltage $V_n \geq$ setting voltage $V_x$, the procedure goes to Step S4-1. If detected voltage $V_n <$ setting voltage $V_x$, the procedure goes to step S4-2.

(Step S4-1, Chemical Resistance Component $R_p$ Correction)

Subsequently, the chemical resistance component $R_p$ is corrected based on the pulse discharging or charging time $t_1$ to the present. Specifically, in the case of detected voltage $V_n \geq$ setting voltage $V_x$, $R_{p\ now}$ as a current chemical resistance component $R_p$ is calculated based on the following equation.

$$R_{p\ now}=R/R_{ini}*R_{p\ ini}*t_{au\ t} \quad \text{Equation 4}$$

The time t of $t_{au\ t}$ is the duration of the current discharging or charging operation.

(Step S4-2, Chemical Resistance Component $R_p$ Correction)

Also, in the case of detected voltage $V_n <$ setting voltage $V_x$, $R_{p\ now}$ is calculated based on the following equation.

$$R_{p\ now}=R/R_{ini}*R_{p\ ini}*t_{au\ t}*a_{\_Rp} \quad \text{Equation 5}$$

$a_{\_Rp}$ is a coefficient depending on a ratio $V_x/V_n$, and is obtained from LUT or based on an approximate expression. $V_x$, refers to the minimum voltage until which the I-V plot shown in FIG. 3 continuously has linearity.

(Step S5, Voltage Variation $V_h$ Calculation Based On Past Charging/Discharging Operation History)

Subsequently, a voltage variation $V_h$ is acquired based on the past charging/discharging operation history. Specifically, values of (Chemical Resistance Component $R_p$)*(Current I) are stored for the past n times of pulse charging/discharging operations. $V_{h\_t}$ is obtained from LUT or based on an expression (time attenuation expression) that is determined in accordance with on time t after the end of each of the pulse charging/discharging operations. The voltage variation $V_h$ can be calculated based on the following equation.

$$V_h=R_p*I*V_{h\_t} \quad \text{Equation 6}$$

The voltage variation $V_h$ is acquired for each of the past n times of pulse charging/discharging operations. After that, $\Sigma V_h$ is obtained. In this equation, the current I and the chemical resistance component $R_p$ are the last values of each pulse charging/discharging operation. In this embodiment, $V_h$ is calculated for the past five times of pulse charging/discharging operations.

(Step S6, Corrected Physical and Chemical Resistance Components $R_{o\_now\ and\ Rp\_now}$ Calculation)

Subsequently, the physical resistance component $R_o$ is corrected based on temperature and SOC to calculate $R_{o\_now}$. Specifically, $R_{o\_now}$ is calculated by the following equation.

$$R_{o\_now} = R_o * a_{\_SOC\_T} \qquad \text{Equation 7}$$

$a_{\_SOC\_T}$ is obtained from LUT in accordance with SOC and temperature.

In addition, the chemical resistance component $R_p$ can be corrected to calculate $R_{p\_now}$. For example, in order to predict an available maximum current in a particular time $t_2$, the chemical resistor component $R_p$ is corrected based on the estimation time $t_2$ or the sum $(t_1+t_2)$ of the pulse time to the present and the estimation time.

(Step S7, Open-Circuit Voltage $V_o$ Estimation)

Subsequently, the open-circuit voltage $V_o$ is calculated based on the following equation.

The open-circuit voltage $V_o$ is estimated based on the thus-obtained physical resistance component $R_o$ and chemical resistance component $R_p$, the current I, the voltage V, and the voltage variation $V_h$. Specifically, the open-circuit voltage $V_o$ is calculated based on the following equation.

$$V_o = V - I*(R_{p\_now} + R_{o\_now}) - \Sigma V_h \qquad \text{Equation 8}$$

In this equation, V and I are detected values.

In addition, the physical resistance component $R_o$ can be further corrected based on SOC, and the like. For example, in order to predict an available maximum current in a particular time $t_2$, the physical resistance component $R_o$ can be corrected based on $SOC_a$ to $SOC_n$ as SOCs between setting current values $I_a$ and $I_x$, and temperatures at $SOC_a$ to $SOC_n$.

(Step S8, Calculation of Available Current $I_{\_target}$ in Estimation Time $t_2$)

Subsequently, an available current $I_{\_target}$ in the estimation time $t_2$ is calculated. In this embodiment, in order to predict the available maximum current $I_{\_target}$ at a particular time $t_2$, predicted reaching voltages $V_a$ to $V_x$, at setting current values $I_a$ to $I_x$ are first acquired based on the above $R_o$, $R_p$ and $V_o$, after the correction. Specifically, n current values $I_1$ to $I_n$ are specified. Resumed voltage values $V_1$ to $V_n$, corresponding to $I_1$ to $I_n$ are calculated based on the following equation.

$$V_n = V_o + \Delta V_o + I_n*(R/R_{ini}*R_{pini}*t_{au\ t} + R_o*a_{\_SOC\_T}) - \Sigma V_{h\_n} \qquad \text{Equation 9}$$

In this equation, $\Delta V_o$ is a $V_o$, variation amount as capacity increase/decrease of $I_n*t_2$. $a_{\_SOC\_T}$ is a correction coefficient that factors in the capacity increase/decrease of $I_n*t_2$. In addition, $t_{au\ t}$ is corrected based on $t_1+t_2$.

Subsequently, the I-V plot is created based, on $I_a$ to $I_x$ and $V_a$ to $V_x$. Current values $I_{max}$ and $I_{min}$ are acquired corresponding to upper and lower limit voltage values $V_{max}$ and $V_{min}$ at a temperature. The available maximum current in charging operation is set at the thus-obtained $I_{max}$. Also, the available maximum current in discharging operation is set at $I_{min}$. Specifically, values of $I_{\_target}$ corresponding to $V_{max}$ and $V_{min}$ are acquired from $I_1$ to $I_n$ and $V_1$ to $V_n$ in the I-V plot by using an approximate expression, or interpolation and extrapolation based on two points, or the like.

(Linearity of I-V Plot)

In addition, if the thus-obtained I-V plot has poor linearity at $V_{min}$, $V_1$ to $V_n$, are corrected based on in the following equation.

$$V_{n\_adjust} = V_n*a_{\_Vmini} \qquad \text{Equation 10}$$

In this equation, $a_{\_Vmini}$ is a coefficient depending on a ratio $V_x/V_n$, and is obtained from LUT or based on an approximate expression. $V_x$ refers to the minimum voltage until which the I-V plot continuously has linearity.

Also, if the I-V plot has poor linearity at $V_{min}$, $V_1$ to $V_n$ are corrected based on in the following equation.

$$V_{n\_adjust} = V_o \Delta V_o + I_n*(R_{now}/R_{ini}*R_{p\ ini}*t_{au\ t}*a_{\_Rp} + R_o*a_{\_SOC\_T}) - \Sigma V_{h\_n} \qquad \text{Equation 11}$$

In this equation, $a_{\_Rp}$ is a coefficient depending on a ratio $V_x/V_n$, and is obtained from LUT or based on an approximate expression. As stated above, $V_x$ refers to the minimum voltage until which the I-V plot continuously has linearity.

(Available Charging/Discharging Current Value)

The calculating portion determines the available charging/discharging current values based on current, voltage, and temperature as discussed above. The calculating portion sets the available maximum current values in charging and discharging operations at the thus-obtained $I_{max}$ and $I_{min}$, respectively. The determined available charging/discharging current values are transmitted to a vehicle side control portion from the connected-device communication terminal 30 through the communication processing portion 19. Thus, the available charging/discharging current values are determined so that the maximum current values of currents in charging/discharging operations of the batteries are restricted based on the determined available charging/discharging current values. As a result, it is possible to maximize the available output of the batteries.

The aforementioned power supply devices can be used as a battery system for vehicles. The power supply device can be installed on electric vehicles such as hybrid cars that are driven by both an engine and a motor, and electric vehicles that are driven only by a motor. The power supply device can be used as a power supply device for these types of vehicles.

Figure 6:
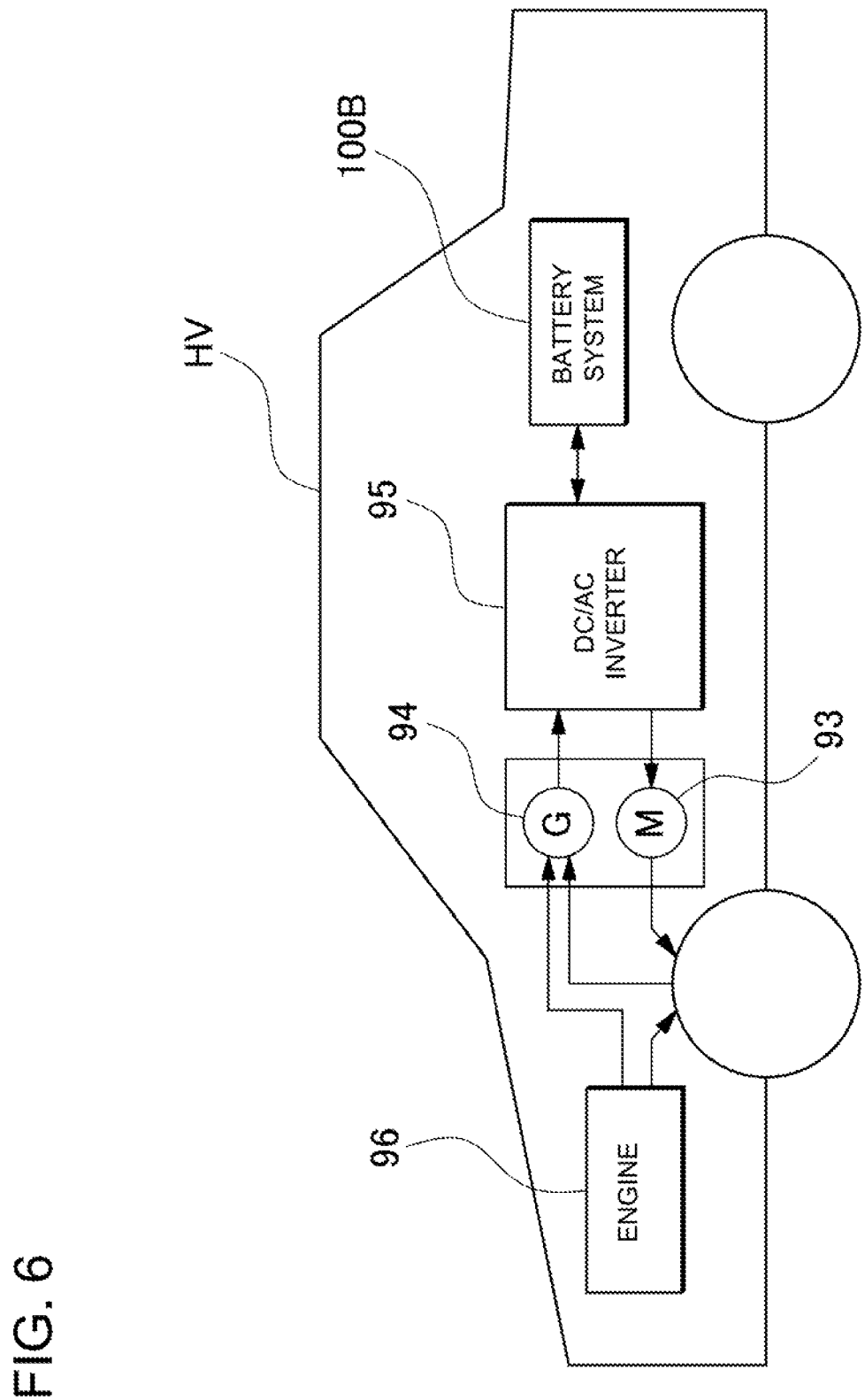
FIG. 6 is a block diagram showing an exemplary hybrid car that is driven by an engine and an electric motor, and includes the power supply device.

FIG. 6 is a block diagram showing an exemplary hybrid car that is driven both by an engine and an electric motor, and includes the power supply device. The illustrated vehicle HV with the power supply device includes an electric motor 93 and an engine 96 that drive the vehicle HV, a power supply device 100B that supplies electric power to the electric motor 93, and an electric generator 94 that charges batteries of the power supply device 100B. The power supply device 100B is connected to the electric motor 93 and the electric generator 94 via a DC/AC inverter 95. The vehicle HV is driven both by the electric motor 93 and the engine 96 with the batteries of the power supply device 100B being charged/discharged. The electric motor 93 is energized and drives the vehicle in a poor engine efficiency range, e.g., in acceleration or in a low speed range. The electric motor 93 is energized by electric power is supplied from the power supply device 100B. The electric generator 94 is driven by the engine 96 or by regenerative braking when users brake the vehicle so that the batteries of the power supply device 100B are charged.

Figure 7:
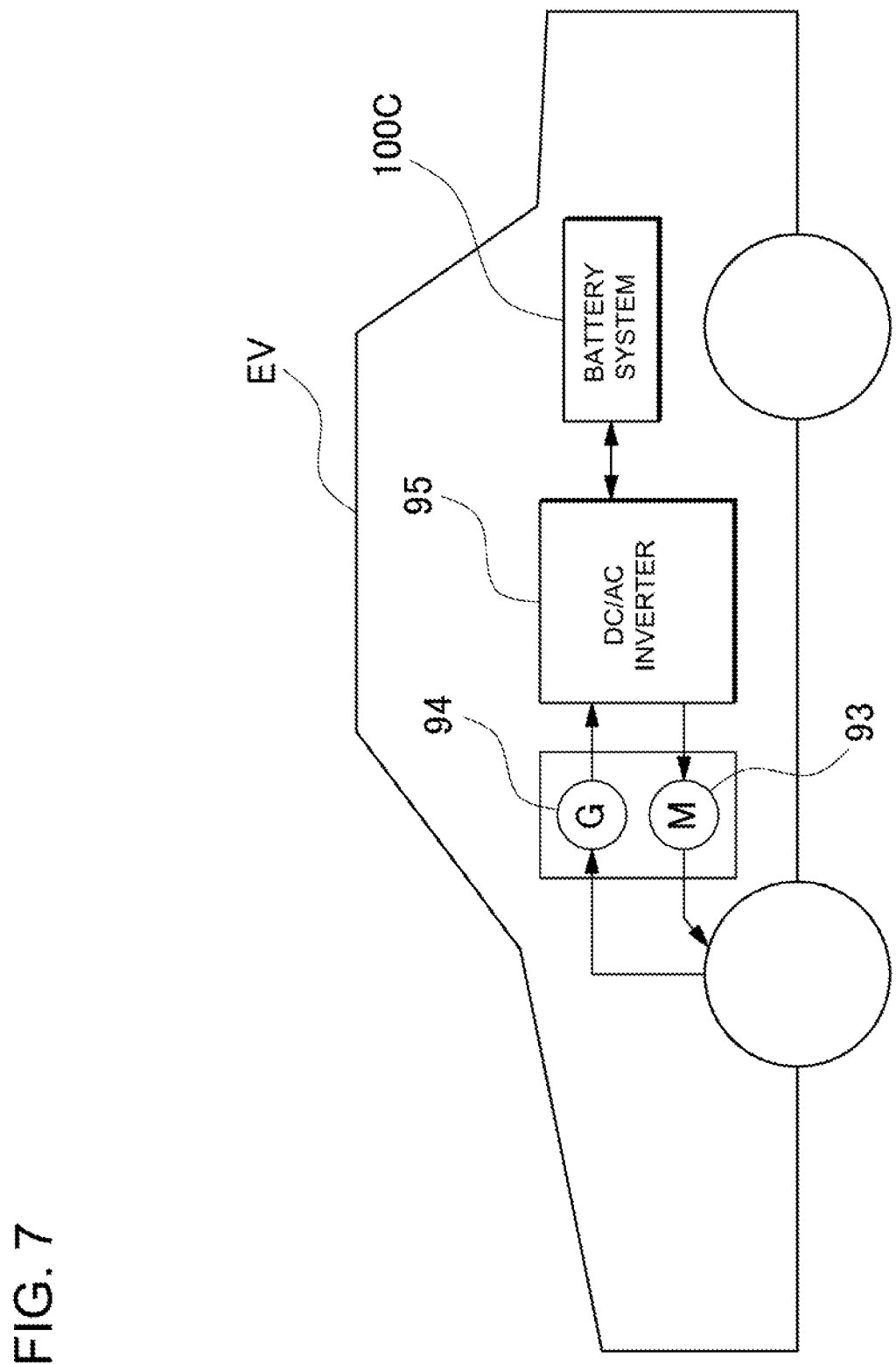
FIG. 7 is a block diagram showing an exemplary electric vehicle that is driven only by an electric motor, and includes the power supply device.

FIG. 7 shows an exemplary electric vehicle that is driven only by an electric motor, and includes the power supply device. The illustrated vehicle EV with the power supply device includes an electric motor 93 that drives the vehicle EV, a power supply device 100C that supplies electric power to the electric motor 93, and an electric generator 94 that charges batteries of the power supply device 100C. The electric motor 93 is energized by electric power that is supplied from the power supply device 100C. The electric generator 94 can be driven by vehicle EV regenerative braking so that the batteries of the power supply device 100C are charged.

Industrial Applicability

A chargeable/dischargeable current calculation method and a power supply device according to the present invention can be suitably applied to power supple devices of plug-in hybrid vehicles and hybrid electric vehicles that can switch between the EV drive mode and the HEV drive mode, electric vehicles, and the like. The application of a chargeable/dischargeable current calculation method and a power supply device according to the present invention are not limited to vehicle power supply devices. A chargeable/dischargeable current calculation method and a power supply device according to the present invention can be suitably applied to high output power supply devices that can supply a large amount of current.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the scope of the invention as defined in the appended claims. The present application is based on Application No. 2009-258442 filed in Japan on Nov. 11, 2009, the content of which is incorporated herein by reference.

What is claimed is:

1. An available charging/discharging current calculation method that estimates available maximum current values in charging/discharging operations of batteries based on at least one of battery current, voltage and temperature, the method comprising the steps of:

calculating a resistance value based on an average current value and an average voltage obtained in a predetermined time period;

dividing the calculated resistance value into a physical resistance component and a chemical resistance component;

correcting the chemical resistance component based on the pulse discharging or charging operation time from the past to the present;

acquiring voltage variation values in the history of the past charging/discharging operations;

correcting the physical resistance component based on a detected battery temperature and a detected battery remaining capacity;

estimating battery open-circuit voltages based on the physical and chemical resistance components, and a current, a voltage and the voltage variation values;

obtaining corrected battery open-circuit voltages corresponding to a plurality of setting currents in order to predict the available maximum current values in a particular time;

acquiring predicted reaching voltages corresponding to the plurality of setting currents based on said corrected physical resistance component, said corrected chemical resistance component and said corrected battery open-circuit voltages; and creating a battery current-voltage curve based on said setting currents and said predicted reaching voltages to acquire upper and lower limit voltages and upper and lower limit currents at a temperature whereby assigning the upper and lower limit currents to the available maximum current values in charging operation and discharging operation, respectively.

2. The available charging/discharging current calculation method according to claim 1 further comprising, in order to predict the available maximum current values in the particular time, correcting the chemical resistance component based on the prediction time or the sum of the pulse time until the present and the prediction time, and correcting the physical resistance component based on the battery remaining capacities corresponding to a plurality of setting currents and the battery temperature.

3. The available charging/discharging current calculation method according to claim 1, wherein said resistance value is a weighted average value of a resistance value acquired in the past and a resistance value acquired at the present.

4. The available charging/discharging current calculation method according to claim 1, wherein said voltage variation is the sum of values obtained by products each of which is obtained by multiplying each of chemical resistances that are subjected to the time-based correction in a predetermined times of pulse charging/discharging operations in the past, the current and a coefficient depending on time from the end of each of the pulse charging/discharging operations.

5. The available charging/discharging current calculation method according to claim 1, wherein said lower limit voltage is set at a voltage until which the battery current-voltage curve can continuously have linearity.

6. The available charging/discharging current calculation method according to claim 1, wherein if said lower limit voltage is set at a low voltage until which the battery current-voltage curve cannot continuously have linearity, said predicted reaching voltages are corrected.

7. The available charging/discharging current calculation method according to claim 6, wherein, in order to correct said predicted reaching voltages, said predicted reaching voltages are corrected based on the difference or ratio between said predicted reaching voltages and said lower limit voltage until which the battery current-voltage curve can continuously have linearity.

8. The available charging/discharging current calculation method according to claim 7, wherein the voltage is corrected, or the chemical resistance component or the physical resistance component are corrected based on said difference or ratio between said predicted reaching voltages and said lower limit voltage, and the predicted reaching voltages are acquired again.

9. The available charging/discharging current calculation method according to claim 1, wherein when a detected voltage is not higher than a setting voltage, the chemical resistance component is corrected.

10. The available charging/discharging current calculation method according to claim 1, wherein said batteries are lithium-ion rechargeable batteries.

11. The available charging/discharging current calculation method according to claim 1 further comprising transmitting the estimated available charging/discharging current values to a connected device that has an information processing system.

* * * * *